United States Patent
Hsing Chen et al.

(10) Patent No.: US 9,470,381 B2
(45) Date of Patent: Oct. 18, 2016

(54) LIGHT-EMITTING DEVICE HAVING CIRCULAR LIGHT EMISSION

(71) Applicant: PROLIGHT OPTO TECHNOLOGY CORPORATION, Taoyuan County (TW)

(72) Inventors: Chen-Lun Hsing Chen, Taoyuan County (TW); Jung-Hao Hung, Taoyuan County (TW); Meng-Ting Hsieh, Taoyuan County (TW)

(73) Assignee: Prolight Opto Technology Corporation, Zhongli (TW)

( * ) Notice: Subject to any disclaimer, the term of this patent is extended or adjusted under 35 U.S.C. 154(b) by 140 days.

(21) Appl. No.: 14/454,916

(22) Filed: Aug. 8, 2014

(65) Prior Publication Data

US 2016/0003425 A1 Jan. 7, 2016

(30) Foreign Application Priority Data

Jul. 3, 2014 (TW) .............................. 103211855 U

(51) Int. Cl.
| | |
|---|---|
| *F21K 99/00* | (2016.01) |
| *H01L 33/58* | (2010.01) |
| *F21V 1/02* | (2006.01) |
| *F21V 9/16* | (2006.01) |
| *H01L 33/48* | (2010.01) |

(52) U.S. Cl.
CPC . *F21K 9/58* (2013.01); *F21V 1/02* (2013.01); *F21V 9/16* (2013.01); *H01L 33/58* (2013.01); *H01L 33/486* (2013.01); *H01L 2933/0058* (2013.01)

(58) Field of Classification Search
CPC .............. F21K 9/58; F21V 1/02; F21V 9/16; H01L 33/58; H01L 33/486; H01L 2933/0058
USPC ................. 362/249.02, 311.02, 800
See application file for complete search history.

(56) References Cited

U.S. PATENT DOCUMENTS

| | | | |
|---|---|---|---|
| 8,378,369 B2 * | 2/2013 | Hanawa .................. | H01L 33/46 257/88 |
| 2011/0299287 A1 * | 12/2011 | Liao ........................ | F21V 14/06 362/294 |
| 2012/0319563 A1 * | 12/2012 | Ishihara ................ | H01L 33/505 313/498 |
| 2013/0033876 A1 * | 2/2013 | Venturini .................. | F21V 5/04 362/311.02 |

* cited by examiner

*Primary Examiner* — Laura Tso

(74) *Attorney, Agent, or Firm* — Rosenberg, Klein & Lee

(57) ABSTRACT

The present invention provides a light-emitting device having circular light emission. By disposing a light-emitting chip on a substrate and a frame on one side of the light-emitting chip, a transparent sheet is disposed on the frame. In addition, a shade layer is disposed on one surface of the transparent sheet and an opening is disposed at the center of the shade layer for providing circular light emission. Alternatively, the opening can be formed on the frame and aligning with the light-emitting and thus providing circular light emission.

10 Claims, 10 Drawing Sheets

LIGHT-EMITTING DEVICE HAVING CIRCULAR LIGHT EMISSION

FIELD OF THE INVENTION

The present invention relates generally to a light-emitting device, and particularly to a light-emitting device having circular light emission.

BACKGROUND OF THE INVENTION

The invention of electric lights radically changes human beings' lifestyle. If there were no electric light in our lives, all works halt in the night or bad weather conditions. Given lighting is limited, it is very possible that the way houses are built and people's lifestyle will be completely different. No human being will make progress but stay in the backward age. Compared with general bulbs, light-emitting diodes (LEDs) own the advantages of lightness, long lifetime, saving power, fast switching speed, monochrome, and high reliability. Thereby, LEDs have become an indispensable optoelectric device in our daily lives.

Currently, the manufacturing methods of LEDs are novel and advanced, and thus forward LEDs, flip-chip LEDs, and vertical LEDs are developed. No matter what type of LEDs, the shapes of the emitted light are not circular. Compared with the traditional light sources, the shapes of the emitted light of LEDs are point light sources with directivity. Given the light perviousness of the whole LED, side light emission is not limited. In addition, the distribution of the light emission of most LEDs is projecting forward. Thereby, the shape of light emission of LEDs is always the subject for development for improving the light-emitting efficiency.

There is no frame in the LED fabrication process for confining the shape of light emission on the periphery of LED chips presently. Thereby, the shapes of light emission of LED chips according to the prior art are not confined for emitting a light beam. That is to say, the light-emitting device according to the prior cannot achieve straight light projection. Nowadays, LEDs are applied to massive lighting facilities. If LEDs are used as projecting light, due to their property of point light source, the illumination range cannot be concentrated by a reflection hood. Thereby, LEDs still cannot effectively replace the traditional lighting in the applications requiring spotlight effect, such as product exhibition or light focusing applications.

Accordingly, the present invention provides a light-emitting device having circular light emission, which provides circuit light emission as well as providing spotlight-like light emission.

SUMMARY

An objective of the present invention is to provide a light-emitting device having circular light emission, which provides circular light emission by using a shade layer.

In order to achieve the objective and effect described above, the present invention discloses a light-emitting device having circular light emission, which comprises a substrate, a light-emitting chip, at least a frame, and a transparent sheet. The light-emitting chip, together with the frame, is disposed on the substrate. The frame is located on one side of the light-emitting chip. The transparent sheet is disposed on the frame and located in a light-emitting direction of the light-emitting chip. A shade layer is disposed on one surface of the transparent sheet. The shade layer has an opening at the center and corresponding to the location of the light-emitting chip. Thereby, the shape of light emission of the light-emitting chip is confined by the opening and forming a circular shape of light.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
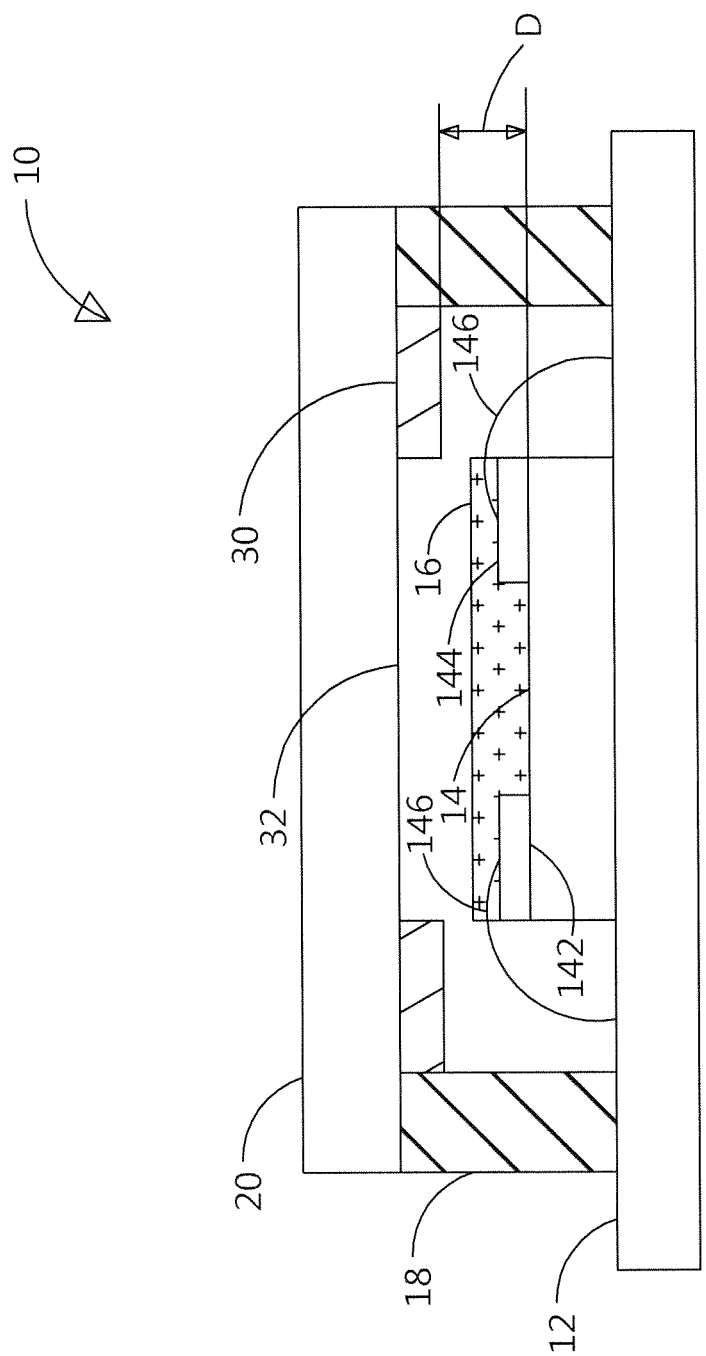
FIG. 1 shows a structural schematic diagram according to a preferred embodiment of the present invention.
Figure 2:
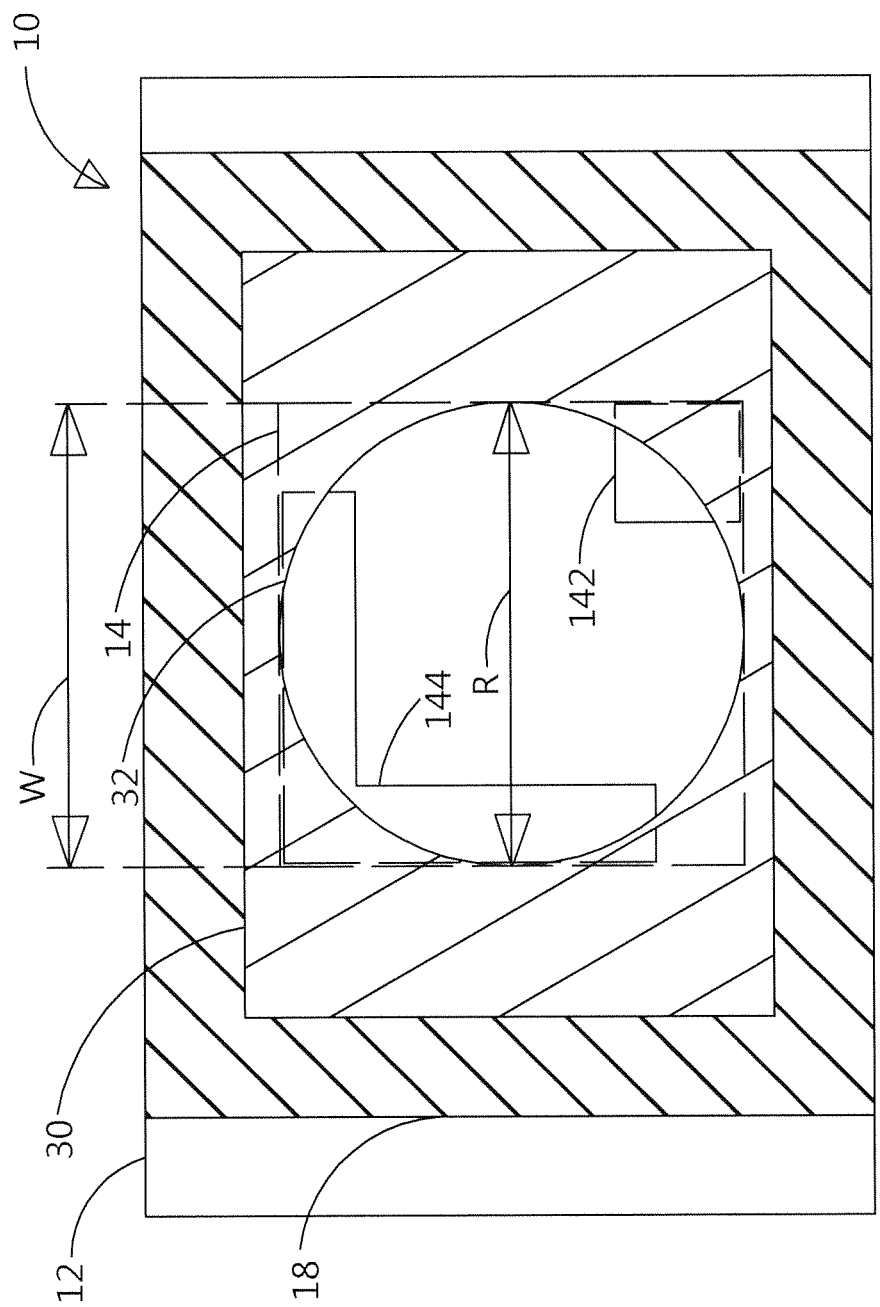
FIG. 2 shows a partial top view of FIG. 1.

Please refer to FIG. 1 and FIG. 2, which show a structural schematic diagram according to a preferred embodiment of the present invention and a partial top view of FIG. 1. As shown in FIG. 1, the light-emitting device 10 according to the present invention comprises a substrate 12, a light-emitting chip 14, a fluorescent layer 16, a frame 18, and a transparent sheet 20. The light-emitting chip 14 according to the present embodiment is a forward LED with a first electrode 142 and a second electrode 144 thereon. A shade layer 30 is disposed on one surface of the transparent sheet 20. The shade layer 30 has an opening 32.

The light-emitting chip 14 and the frame 18 are disposed on the substrate 12. The first and second electrodes 142, 144 are disposed on two sides of the light-emitting chip 14. As shown in FIG. 2, the first and second electrodes 142, 144 according to the present embodiment are located on the two corners of the light-emitting chip 14. Nonetheless, the present invention is not limited to the arrangement. Alternatively, the distribution of the electrodes can be changed according to the requirement. A plurality of wires 146 are connected electrically with the first and second electrodes 142, 144, and then connected to the external circuitry via the substrate 12. The frame 18 is located on one side of the light-emitting chip 14. As shown in FIG. 2, the frame 18 according to the present embodiment surrounds the light-emitting chip 14. Nonetheless, the present invention is not limited to the arrangement. Alternatively, the frame 18 can be also disposed on at least one side of the light-emitting chip 14.

The fluorescent layer 16 is disposed on the light-emitting chip 14, namely, covering the light-emitting chip 14 and the first and second electrodes 142, 144, as well as some wires 146. Nonetheless, the present invention is not limited by this arrangement. Alternatively, the first and second electrodes 142, 144 can be exposed from the fluorescent layer 16. Depending on the type of the light-emitting chip 14, the fluorescent layer 16 can be altered accordingly. For example, if the light-emitting chip 14 is a blue LED, the fluorescent layer 16 will include green and red fluorescent powders. Thereby, the fluorescent layer 16 will be excited and emitting green and red light in accordance with the blue light emitted by the LED, and thus giving white light by mixing the red, green, and blue light. Moreover, the fluorescent layer 16 will be excited and emitting yellow light in accordance with the blue light emitted by the LED, and thus giving warm white light by mixing the blue and yellow light.

The transparent sheet 20 is disposed on the frame 18 and situated above the light-emitting chip 14 as located on a light-emitting direction of the light-emitting chip 14. The shade layer 30 is disposed on one side of the transparent sheet 20. The shade layer 30 according to the present embodiment is disposed on a plane of the transparent sheet 20 facing the light-emitting chip 14 by printing. In other words, the shade layer 30 is disposed between the transparent sheet 20 and the light-emitting chip 14. There is a gap D between the shade layer 30 and the light-emitting chip 14 for wire bonding. Nonetheless, the present invention is not limited to the arrangement. The shade layer 30 can be alternatively disposed on the transparent sheet 20. Hence, the gap D further includes the thickness of the transparent sheet 20. The opening 32 of the shade layer 30 corresponds to the location of the light-emitting chip 14, which is disposed at the center of the substrate 12. Thereby, the opening 32 is also disposed at the center of the shade layer 30 correspondingly. Besides, the diameter R of the opening 32 is less than or equal to the minimum width W of the light-emitting chip 14. As shown in FIG. 2, the diameter R of the opening 32 is equal to the width W of the light-emitting chip 14. The diameter R of the opening 32 can also be less than the minimum side length of the light-emitting chip 14. Thereby, by using the opening 32, the light emission of the LED 14 of the light-emitting device 10 can become circular.

Figure 3:
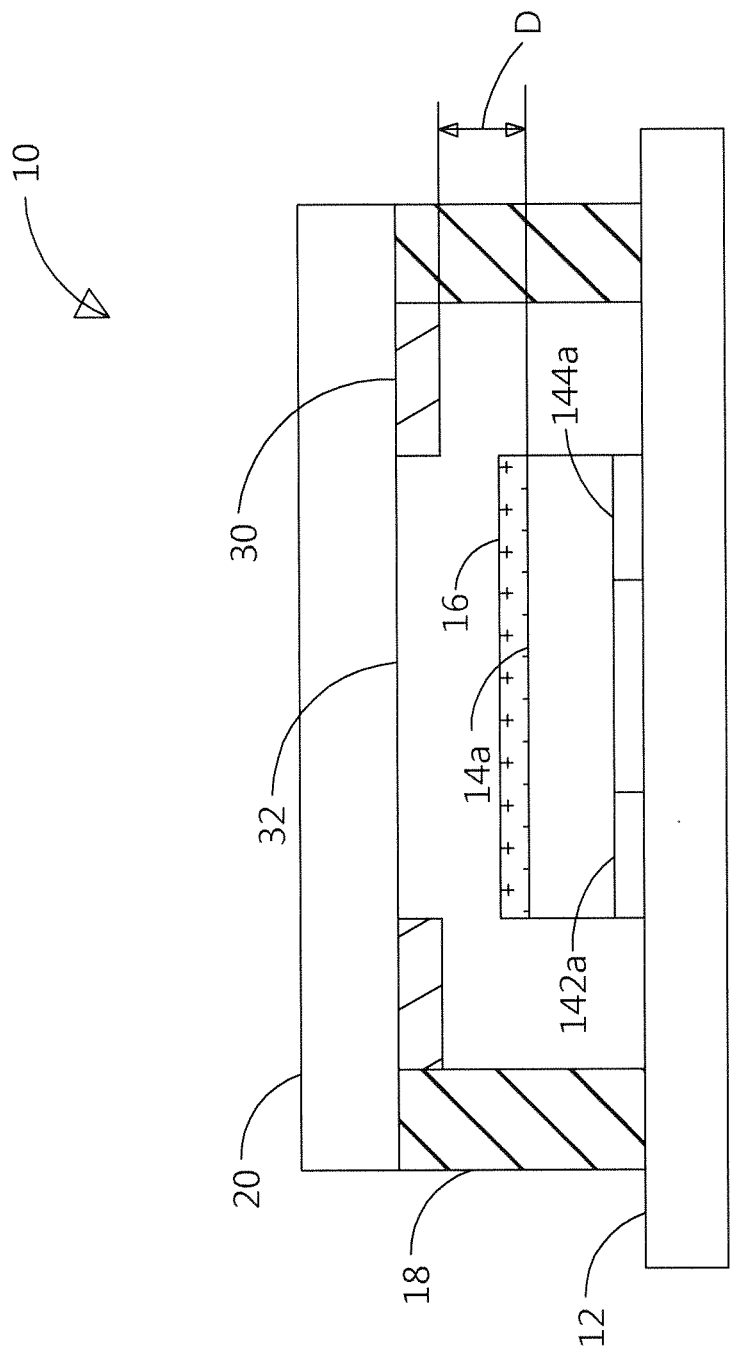
FIG. 3 shows a structural schematic diagram according to another preferred embodiment of the present invention.
Figure 4:
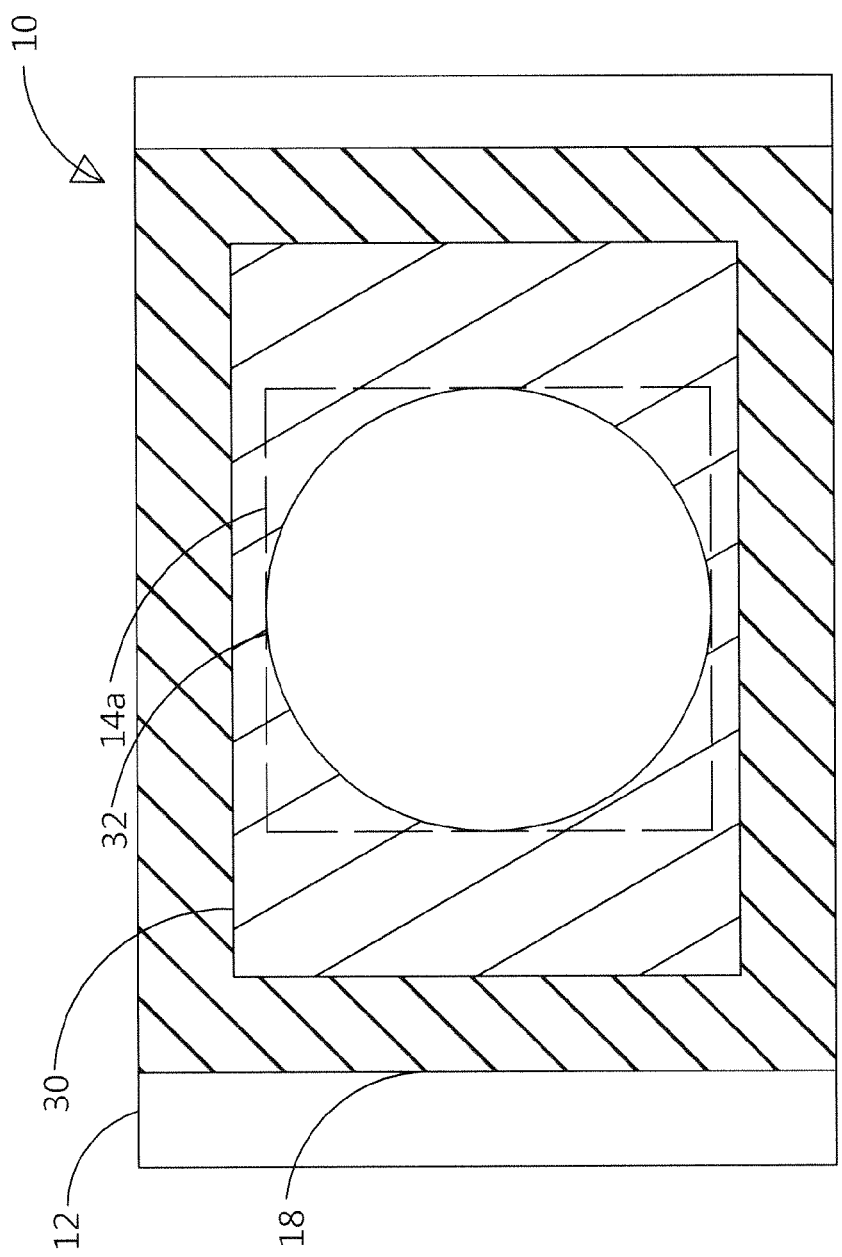
FIG. 4 shows a partial top view of FIG. 3.

Please refer to FIG. 3 and FIG. 4, which show a structural schematic diagram according to another preferred embodiment of the present invention and a partial top view of FIG. 3. The difference between FIGS. 1 and 3 is that a forward LED is adopted in FIG. 1 while a flip-chip LED is adopted in FIG. 3 instead. As shown in FIG. 3, the light-emitting chip 14a is disposed on the substrate 12. Because the light-emitting chip 14a according to the present embodiment is a flip-chip LED, the light-emitting chip 14a is inversely disposed on the substrate 12. Then, the light-emitting chip 14a is connected electrically to the first and second electrodes 142a, 144a on the substrate 12 and thus further connected to the external circuitry. The rest of connection is identical to that in the previous embodiment. Hence, the details will not be described again. In addition, because no wire bonding is required for flip-chip LEDs, no gap is required between the light-emitting chip 14a and the shade layer 30.

Figure 5:
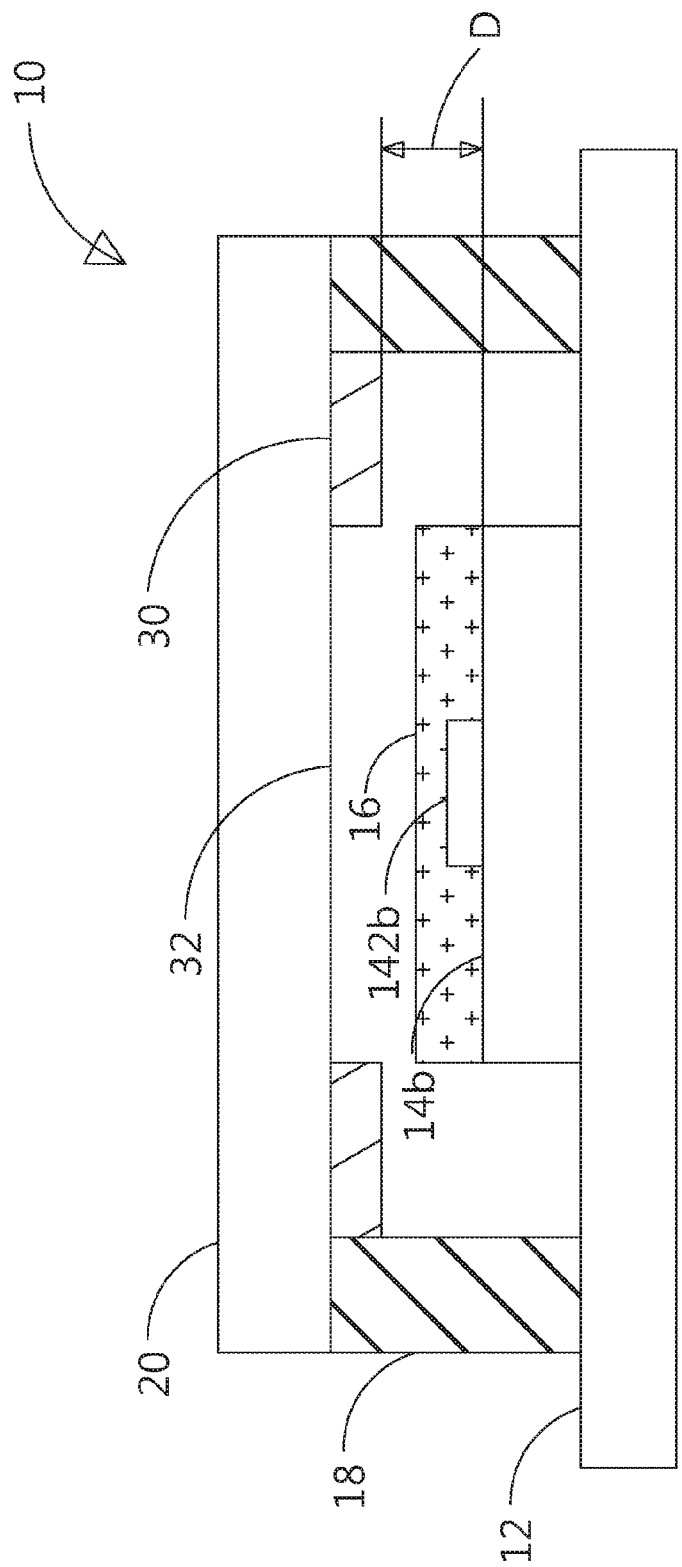
FIG. 5 shows a structural schematic diagram according to another preferred embodiment of the present invention.
Figure 6:
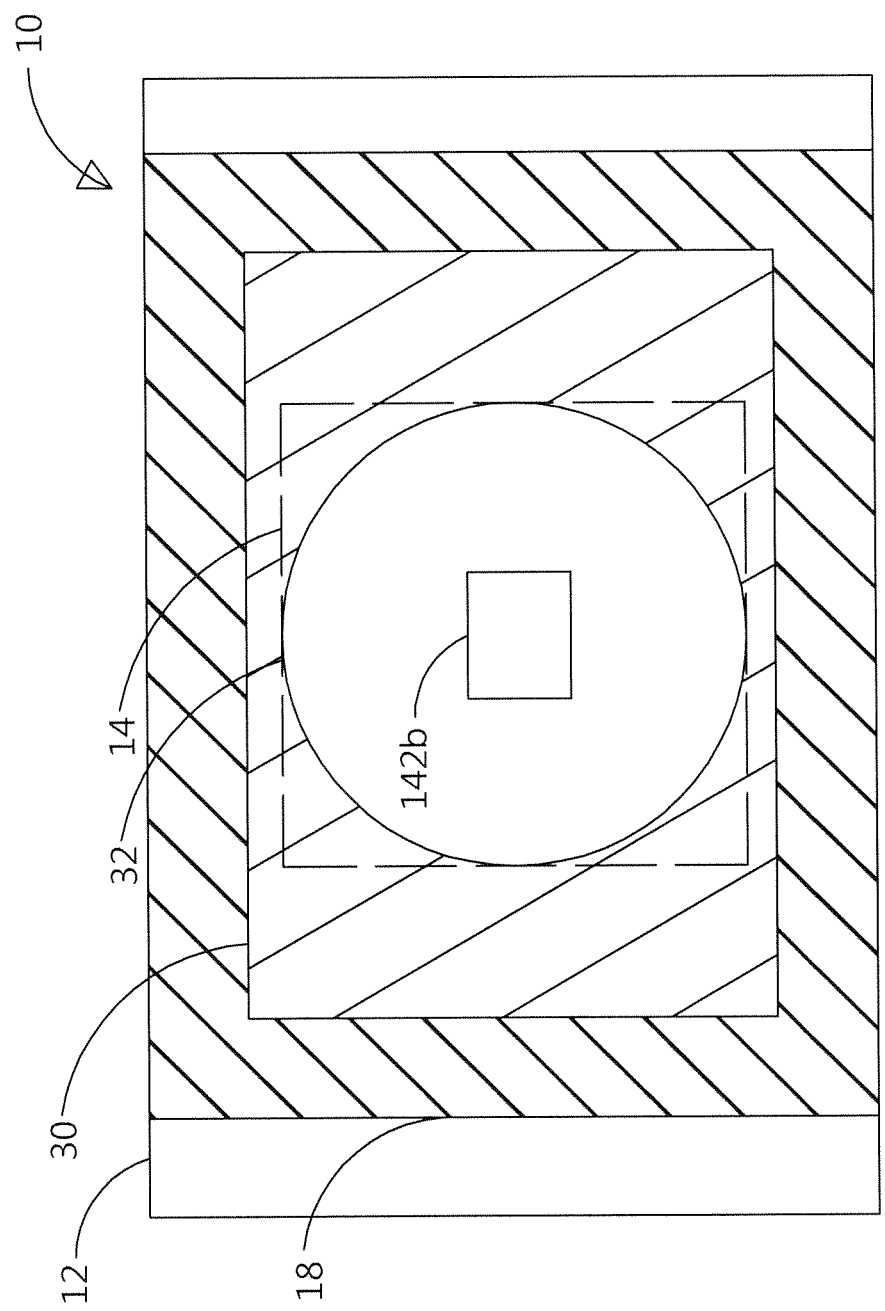
FIG. 6 shows a partial top view of FIG. 5.

Please refer to FIG. 5 and FIG. 6, which show a structural schematic diagram according to another preferred embodiment of the present invention and a partial top view of FIG. 5. The difference between FIGS. 3 and 5 is that a flip-chip LED is adopted in FIG. 3 while a vertical LED is adopted in FIG. 5 instead. As shown in FIG. 5, the light-emitting chip 14b according to the present invention is disposed on the substrate 12. Because the light-emitting chip 14b according to the present embodiment is a vertical LED, the bottom of the light-emitting chip 14b is connected electrically to the substrate 12, and hence connected electrically to the external circuitry via the first electrode 142b. The rest of connection is identical to that in the embodiment of FIG. 1. Hence, the details will not be described again.

Figure 7:
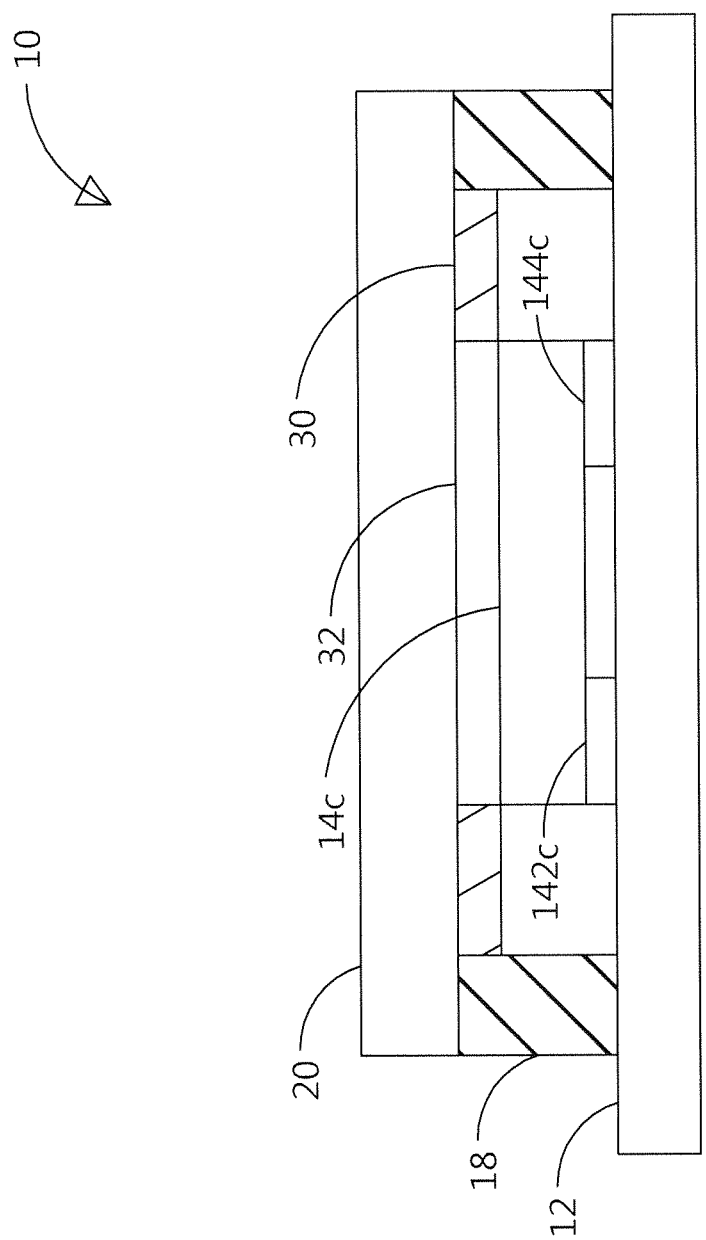
FIG. 7 shows a structural schematic diagram according to another preferred embodiment of the present invention.
Figure 8:
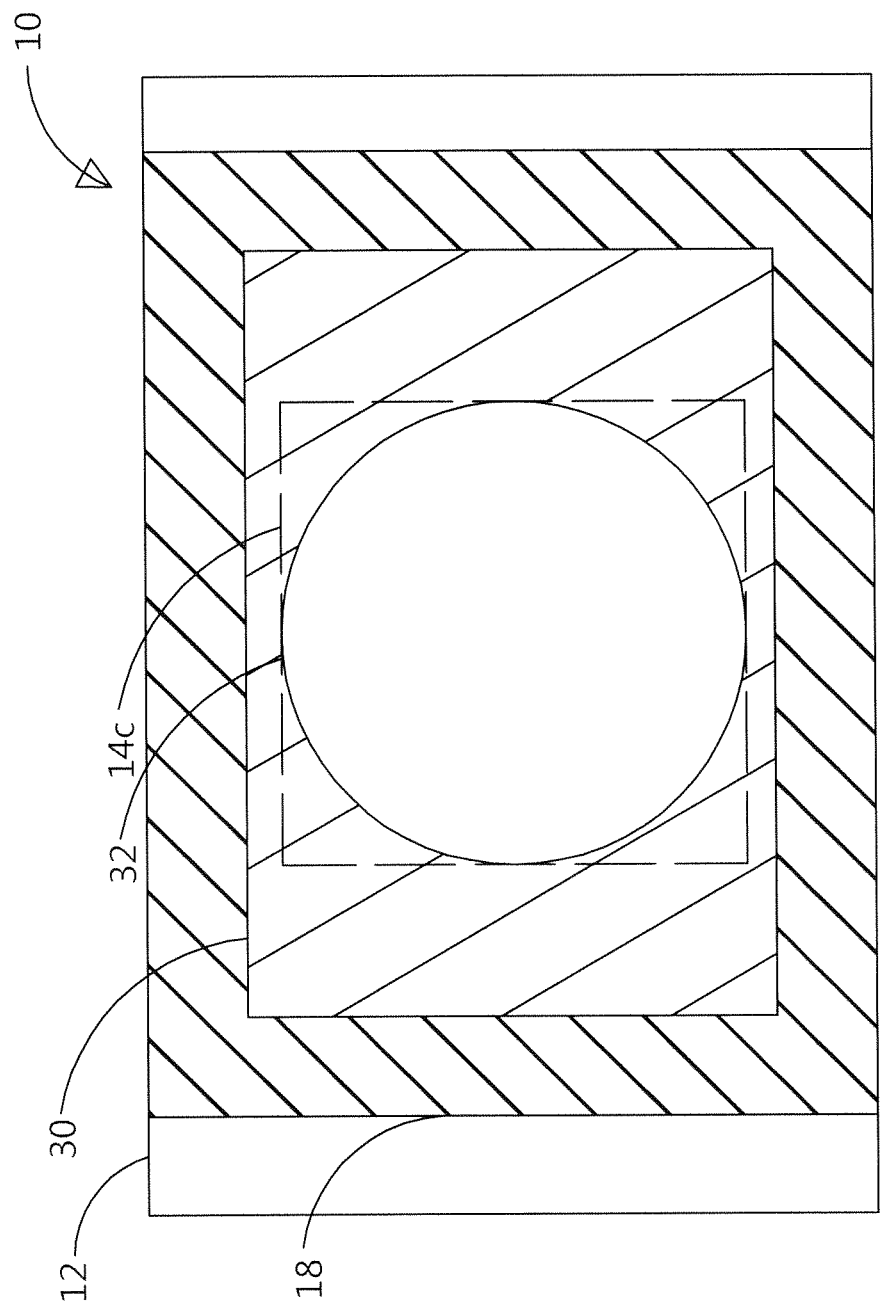
FIG. 8 shows a partial top view of FIG. 7.

Please refer to FIG. 7 and FIG. 8, which show a structural schematic diagram according to another preferred embodiment of the present invention and a partial top view of FIG. 7. The difference between FIGS. 5 and 7 is that a vertical LED with a fluorescent layer is adopted in FIG. 5 while a flip-chip LED without fluorescent layer is adopted in FIG. 7 instead. As shown in FIG. 7, the light-emitting chip 14c according to the present invention is disposed on the substrate 12. Because the light-emitting chip 14c according to the present embodiment includes red, green, and blue LEDs, it can emit red, green, and blue light, respectively, for mixing and giving white light. The light-emitting chip 14c is placed inversely on the substrate 12, thereby it is connected electrically to the substrate via the first and second electrode 142c, 144c for connecting to the external circuitry. The rest of connection is identical to that in the embodiment of FIG. 1. Hence, the details will not be described again. In addition, no gap is required between the light-emitting chip 14c and the shade layer 30.

Figure 9:
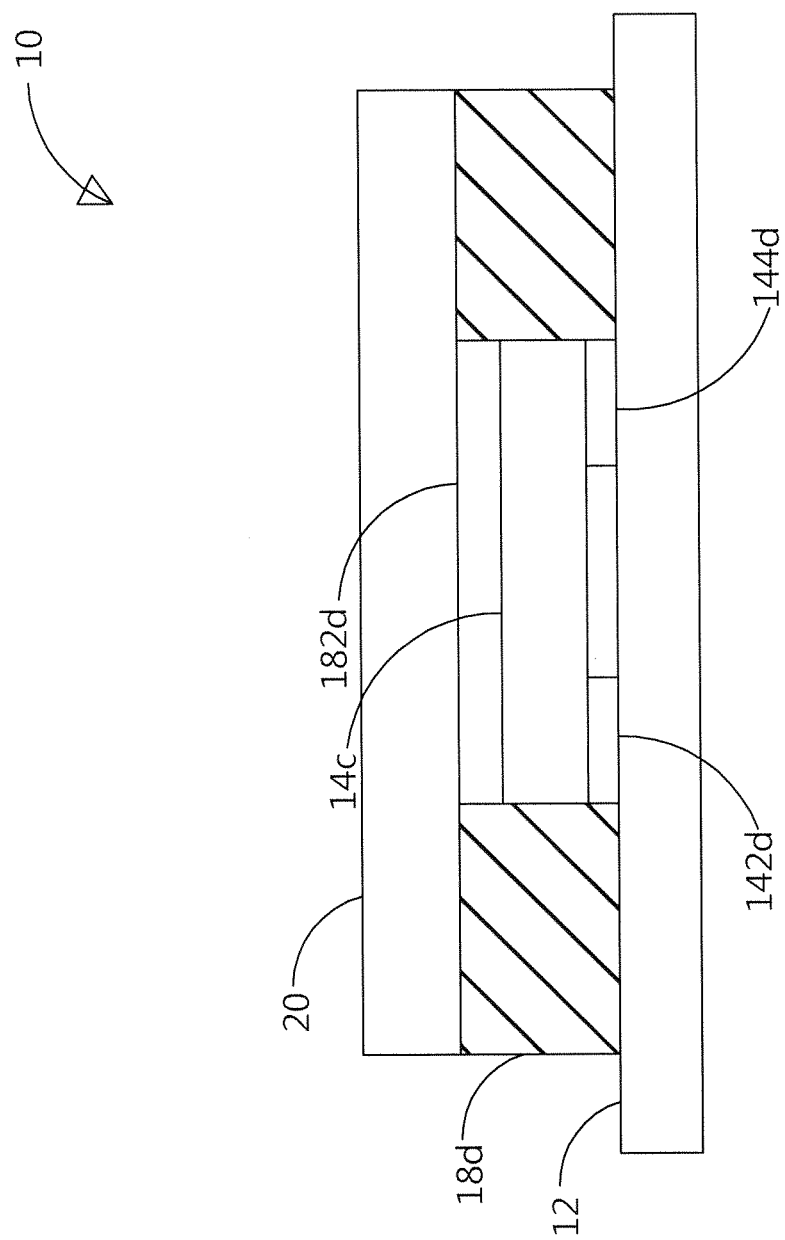
FIG. 9 shows a structural schematic diagram according to another preferred embodiment of the present invention.
Figure 10:
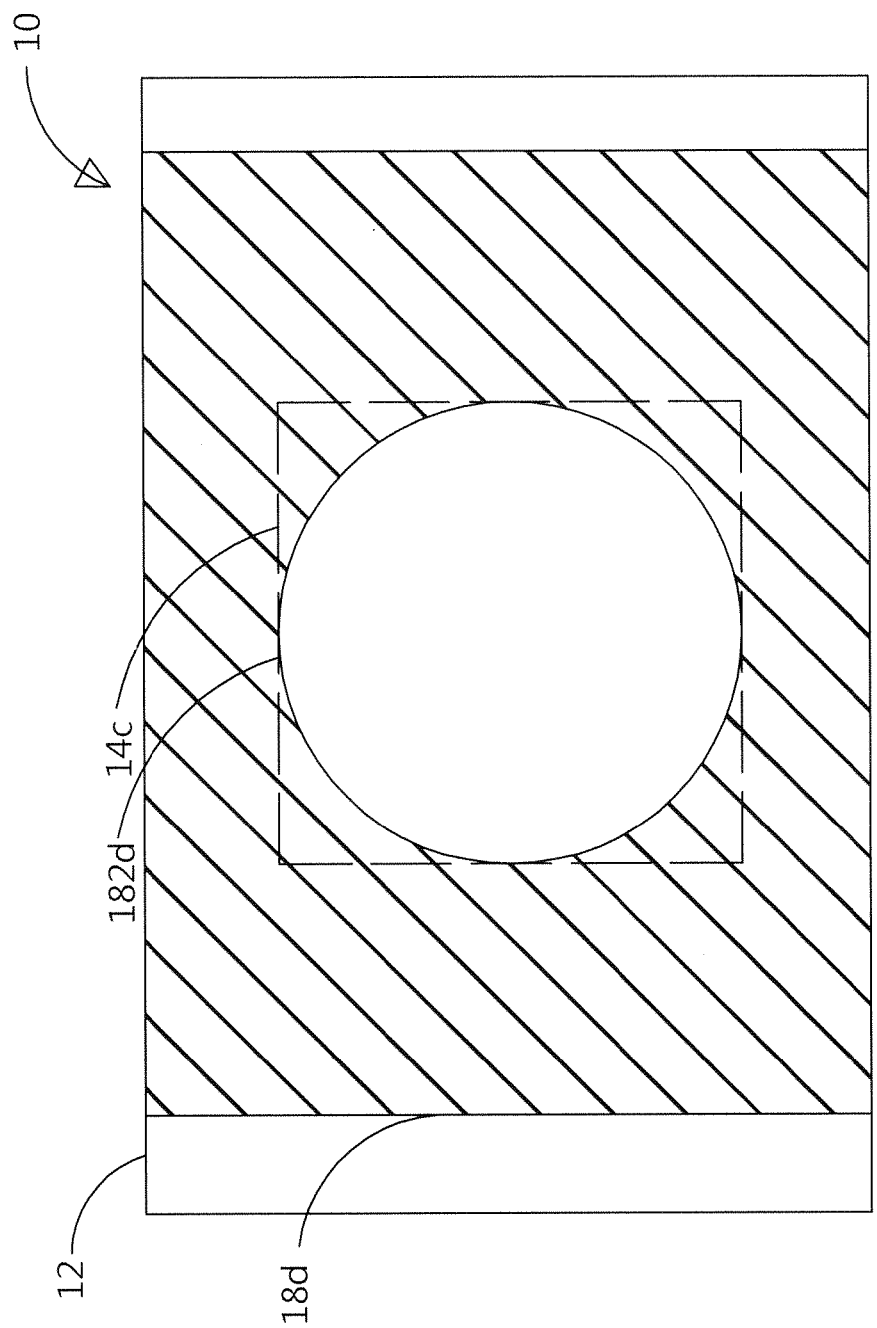
FIG. 10 shows a partial top view of FIG. 9.

Please refer to FIG. 9 and FIG. 10, which show a structural schematic diagram according to another preferred embodiment of the present invention and a partial top view of FIG. 9. The difference between FIGS. 7 and 9 is that a flip-chip LED with a shade layer is adopted in FIG. 7 while a flip-chip LED without shade layer is adopted in FIG. 9 instead. As shown in FIG. 9, the light-emitting chip 14d according to the present invention is disposed on the substrate 12. The frame 18d forms an opening 182d. Because the light-emitting chip 14d according to the present embodiment includes red, green, and blue LEDs, it can emit red, green, and blue light, respectively, for mixing and giving give white light. The light-emitting chip 14d is placed inversely on the substrate 12, thereby it is connected electrically to the substrate via the first and second electrode 142d, 144d for connecting to the external circuitry. The rest of connection is identical to that in the embodiment of FIG. 1. Hence, the details will not be described again. In addition, a fluorescent layer can be further disposed on the light-emitting chip 14d for generating excited light according to the light emitted by the light-emitting chip 14. For example, if the light-emitting chip 14d is a blue LED, the fluorescent layer 16 will include green and red fluorescent powders. Thereby, the fluorescent layer will be excited and emitting green and red light in accordance with the blue light emitted by the LED, and thus giving white light by mixing the red, green, and blue light. Moreover, the fluorescent layer will be excited and emitting yellow light in accordance with the blue light emitted by the light-emitting chip 14d, and thus giving warm white light by mixing the blue and yellow light.

To sum up, the present invention provides an LED having circular light emission. By disposing the light-emitting chip on the substrate and the transparent sheet having the shade layer above the light-emitting chip, the light-emitting chip can form circular light emission using the shade layer.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A light-emitting device having circular light emission, comprising:
   a substrate;

a light-emitting chip, disposed on said substrate;
a frame, disposed on one side of said light-emitting chip; and
a transparent sheet, disposed on said frame, located on a light-emitting direction of said light-emitting chip, having a shade layer on one surface, said shade layer having an opening corresponding to the location of said light-emitting chip, and forming circular light mission via said opening.

2. The light-emitting device of claim 1, wherein a gap is located between said transparent sheet and said light-emitting chip.

3. The light-emitting device of claim 1, wherein said shade layer is located between said transparent sheet and said light-emitting chip.

4. The light-emitting device of claim 1, wherein said shade layer is located on said transparent sheet.

5. The light-emitting device of claim 1, wherein the diameter of said opening is less than or equal to the minimum width of said light-emitting chip.

6. The light-emitting device of claim 1, and further comprising a fluorescent layer disposed between said light-emitting chip and said shade layer.

7. A light-emitting device having circular light emission, comprising:
a substrate;
a light-emitting chip, disposed on said substrate; and
a frame, disposed on one side of said light-emitting chip, having an opening corresponding to the location of said light-emitting chip, and forming circular light mission via said opening;
wherein a diameter of said opening is less than or equal to a minimum width of said light-emitting chip.

8. The light-emitting device of claim 7, and further comprising a transparent sheet, disposed on said opening of said frame, and located on a light-emitting direction of said light-emitting chip.

9. The light-emitting device of claim 7, wherein said light-emitting chip is a flip-chip light-emitting diode.

10. The light-emitting device of claim 7, and further comprising a fluorescent layer disposed on said light-emitting chip.

* * * * *